(12) United States Patent
Yoon et al.

(10) Patent No.: US 10,128,382 B2
(45) Date of Patent: Nov. 13, 2018

(54) THIN FILM TRANSISTOR SUBSTRATE, METHOD OF MANUFACTURING THE SAME, AND DISPLAY APPARATUS HAVING THE SAME

(71) Applicant: Samsung Display Co., Ltd., Yongin, Gyeonggi-Do (KR)

(72) Inventors: Seungho Yoon, Hwaseong-si (KR); Bong-Kyun Kim, Hwaseong-si (KR); Youngjun Kim, Seoul (KR); Hongsick Park, Suwon-si (KR); Byeong-Beom Kim, Asan-si (KR); Sangwon Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/866,890

(22) Filed: Jan. 10, 2018

(65) Prior Publication Data

US 2018/0130908 A1 May 10, 2018

Related U.S. Application Data

(62) Division of application No. 14/710,739, filed on May 13, 2015, now Pat. No. 9,899,531.

(30) Foreign Application Priority Data

Aug. 5, 2014 (KR) .................. 10-2014-0100615

(51) Int. Cl.
*G02F 1/1368* (2006.01)
*H01L 29/786* (2006.01)
*H01L 27/12* (2006.01)
*H01L 29/66* (2006.01)
*H01L 21/465* (2006.01)
(Continued)

(52) U.S. Cl.
CPC ........ *H01L 29/7869* (2013.01); *H01L 21/465* (2013.01); *H01L 21/467* (2013.01); *H01L 27/124* (2013.01); *H01L 29/45* (2013.01); *H01L 29/66969* (2013.01); *G02F 1/1368* (2013.01); *H01L 23/53238* (2013.01); *H01L 2924/0002* (2013.01)

(58) Field of Classification Search
CPC .. G02F 1/1368; H01L 27/124; H01L 29/7869
See application file for complete search history.

(56) References Cited

U.S. PATENT DOCUMENTS 7,662,715 B2  2/2010  Cho et al.
7,741,641 B2  6/2010  Bae et al.
(Continued)

FOREIGN PATENT DOCUMENTS

JP   2007250804 A   9/2007
JP   2011119467 A   6/2011
(Continued)

*Primary Examiner* — Thanh-Nhan P Nguyen
(74) *Attorney, Agent, or Firm* — Cantor Colburn LLP (57) ABSTRACT

A thin film transistor substrate includes a thin film transistor including a gate electrode, a semiconductor layer, a source electrode and a drain electrode. Each of the source electrode and the drain electrode includes a wire layer and a protective layer. The protective layer includes zinc oxide in an amount greater than about 70% by weight and less than about 85% by weight and indium oxide in an amount greater than about 15% by weight and less than about 30% by weight.

9 Claims, 9 Drawing Sheets

(51) Int. Cl.
*H01L 21/467* (2006.01)
*H01L 29/45* (2006.01)
*H01L 23/532* (2006.01)

(56) References Cited

U.S. PATENT DOCUMENTS

| | | |
|---|---|---|
| 8,426,868 B2 | 4/2013 | Akimoto et al. |
| 8,461,594 B2 | 6/2013 | Morosawa et al. |
| 8,653,515 B2 | 2/2014 | Lee et al. |
| 8,785,241 B2 | 7/2014 | Sasagawa et al. |
| 2012/0211745 A1 | 8/2012 | Ueda et al. |
| 2012/0289005 A1 | 11/2012 | Tanaka et al. |
| 2013/0032793 A1 | 2/2013 | Kim .................... H01L 29/7869 257/43 |
| 2013/0048994 A1 | 2/2013 | Choi .................... H01L 29/458 257/59 |
| 2013/0299817 A1 | 11/2013 | Park et al. |

FOREIGN PATENT DOCUMENTS

| | | |
|---|---|---|
| JP | 2011192679 A | 9/2011 |
| KR | 1020150034001 A | 4/2015 |

THIN FILM TRANSISTOR SUBSTRATE, METHOD OF MANUFACTURING THE SAME, AND DISPLAY APPARATUS HAVING THE SAME

This application is a divisional application of U.S. application Ser. No. 14/710,739 filed on May 13, 2015, which claims priority to Korean Patent Application No. 10-2014-0100615, filed on Aug. 5, 2014, and all the benefits accruing therefrom under 35 U.S.C. § 119, the contents of which are hereby incorporated by reference in its entirety.

BACKGROUND

1. Field

The invention relates to a thin film transistor substrate, a method of manufacturing the same, and a display apparatus having the same. More particularly, the invention relates to a thin film transistor substrate having improved electrical characteristics, a method of manufacturing the thin film transistor substrate, and a display apparatus having the thin film transistor substrate.

2. Description of the Related Art

In general, a display apparatus includes a substrate, and pixels arranged on the substrate. Each pixel includes a thin film transistor connected to a gate line and a data line, which are each disposed on the substrate. The thin film transistor receives a gate-on voltage through the gate line and an image signal through the data line.

The thin film transistor is used as a switching device in the display apparatus. A mobility of electric charges, which exerts influence on electrical characteristics of the thin film transistor, is determined depending on the state of a channel area of the thin film transistor, where charge carriers move through the channel area of the thin film transistor.

SUMMARY

One or more exemplary embodiment of the invention provides a thin film transistor substrate capable of reducing defects in a protective layer by improving deposition characteristics of the protective layer used to cover a thin film transistor.

One or more exemplary embodiment of the invention provides a method of manufacturing the thin film transistor substrate.

One or more exemplary embodiment of the invention provides a display apparatus having the thin film transistor substrate.

Exemplary embodiments of the invention provide a display apparatus including a thin film transistor substrate, an opposite substrate facing the thin film transistor substrate, and a liquid crystal layer between the thin film transistor substrate and the opposite substrate.

The thin film transistor substrate includes a base substrate and a thin film transistor. The thin film transistor includes a gate electrode on the base substrate, a semiconductor layer on the gate electrode and including an oxide semiconductor material, and an electrode layer overlapping the semiconductor layer.

The oxide semiconductor material may include an oxide material of at least one of zinc (Zn), indium (In), gallium (Ga) and tin (Sn).

The electrode layer includes a wire layer including a metal, a protective layer on the wire layer, and a barrier layer under the wire layer.

The metal included in the wire layer may include copper or a copper alloy.

The protective layer includes zinc oxide in an amount greater than about 70 percent (%) by weight and less than about 85% by weight and indium oxide in an amount greater than about 15% by weight and less than about 30% by weight.

The barrier layer may be between the wire layer and the semiconductor layer and may block diffusion of a material included in the wire layer to the semiconductor layer. The barrier layer may include at least one of indium-zinc oxide, gallium-zinc oxide and aluminum-zinc oxide.

The electrode layer may include a source electrode and a drain electrode spaced apart from each other.

The display apparatus may further include a gate line and a data line, which are disposed on the base substrate. The gate line is elongated to extend in a first direction and is connected to the gate electrode. The data line is insulated from the gate line. The data line is elongated to extend in a second direction crossing the first direction and is connected to the electrode layer.

Exemplary embodiments of the invention provide a method of manufacturing a thin film transistor substrate, including forming a gate electrode of a thin film transistor on a base substrate, sequentially forming a semiconductor material layer, a barrier material layer, a metal material layer and a protective material layer on the base substrate and the gate electrode, each of the material layers insulated from the gate electrode, forming a first photoresist layer pattern on the protective material layer on the base substrate and the gate electrode, selectively etching the semiconductor material layer, the barrier material layer, the metal material layer and the protective material layer using the first photoresist layer pattern as a mask to form a first structure including a semiconductor pattern, a barrier pattern, a wire pattern and a protective pattern, respectively, removing a portion of the first photoresist layer pattern on the semiconductor pattern, the barrier pattern, the wire pattern and the protective pattern to form a second photoresist layer pattern via which a portion of the first structure is exposed at a channel area of the thin film transistor, and etching the semiconductor pattern, the barrier pattern, the wire pattern and the protective pattern at the channel area of the thin film transistor using the second photoresist layer pattern as a mask to form a second structure including a semiconductor layer, a barrier layer, a wire layer and a protective layer of the thin film transistor, respectively.

The protective material layer includes zinc oxide in an amount greater than about 70% by weight and less than about 85% by weight and indium oxide in an amount greater than about 15% by weight and less than about 30% by weight.

The first structure may be formed using a first etchant that etches the semiconductor material layer, the barrier material layer, the metal material layer and the protective material layer.

The second structure may be formed using a second etchant that etches the semiconductor pattern, the barrier pattern, the wire pattern and the protective pattern at the exposed portion of the first structure.

According to one or more exemplary embodiment, among elements of the thin film transistor, damage to the channel area, the source electrode and the drain electrode thereof may be reduced or effectively prevented. Thus, the electrical characteristics of the thin film transistor substrate including the thin film transistor may be improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

Figure 1:
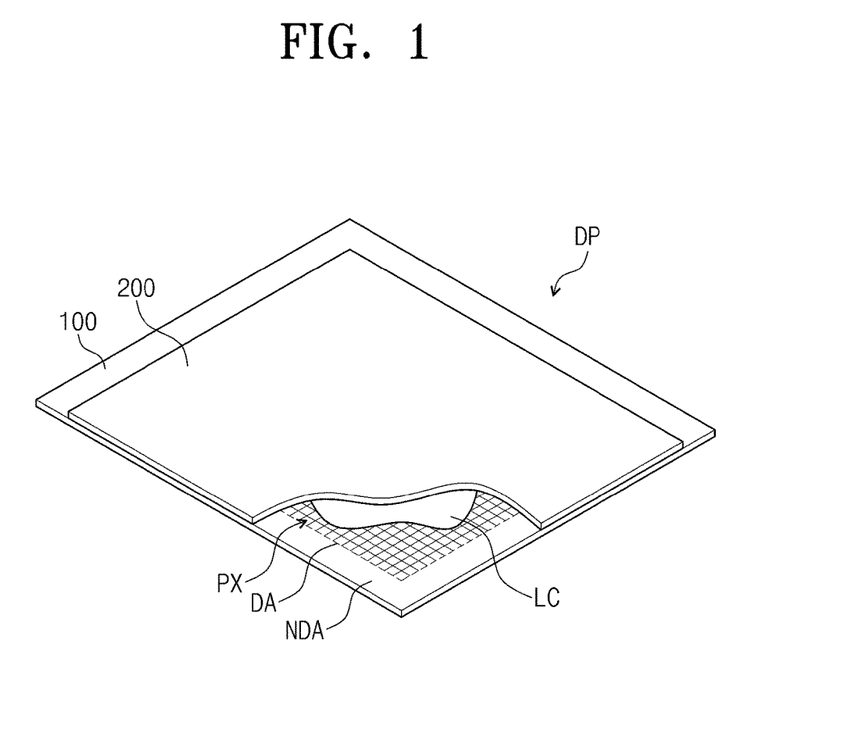
FIG. 1 is a perspective view showing an exemplary embodiment of a display apparatus according to the invention.

FIG. 1 is a perspective view showing an exemplary embodiment of a display apparatus DP according to the invention.

Referring to FIG. 1, the display apparatus DP may be any of a number of various display apparatuses, such as a liquid crystal display apparatus, an organic light emitting display apparatus, an electrophoretic display apparatus, a microelectromechanical system display apparatus, etc. In the illustrated exemplary embodiment, the liquid crystal display apparatus will be described as the display apparatus DP.

The display apparatus DP includes a thin film transistor substrate 100 on which pixels PX are arranged and configured to display an image, an opposite substrate 200 facing the thin film transistor substrate 100, and a liquid crystal layer LC interposed between the thin film transistor substrate 100 and the opposite substrate 200.

The thin film transistor substrate 100 includes a display area DA in which the pixels PX are arranged and an image is displayed, and a non-display area NDA except for the display area DA. The non-display area NDA is disposed adjacent to the display area DA, and no image is displayed in the non-display area NDA. The opposite substrate 200 may include a display area and a non-display area corresponding to those of the thin film transistor substrate 100. Pad circuits (not shown) electrically connect the thin film transistor substrate 100 to a driving circuit (not shown) that applies voltages to the pixels PX. The pad circuits are disposed in the non-display area NDA of the thin film transistor substrate 100.

The opposite substrate 200 is disposed on the thin film transistor substrate 100 and receives a voltage from an external source (not shown), the voltage from the external source being separate from the voltages received by the thin film transistor substrate 100. However, according to another exemplary embodiment, the thin film transistor substrate 100 may receive two different voltages and the opposite substrate 200 may not receive any separate voltage.

The liquid crystal layer LC includes liquid crystal molecules having dielectric anisotropy. When an electric field is formed between the thin film transistor substrate 100 and the opposite substrate 200, the liquid crystal molecules are aligned in a specific direction relative to the thin film transistor substrate 100 and the opposite substrate 200, and thus the liquid crystal molecules control a transmittance of a light traveling through the liquid crystal layer LC. According to another exemplary embodiment, the liquid crystal molecules of the liquid crystal layer LC are driven in response to the two different voltages applied to the thin film transistor substrate 100 to control the transmittance of the light.

Figure 2:
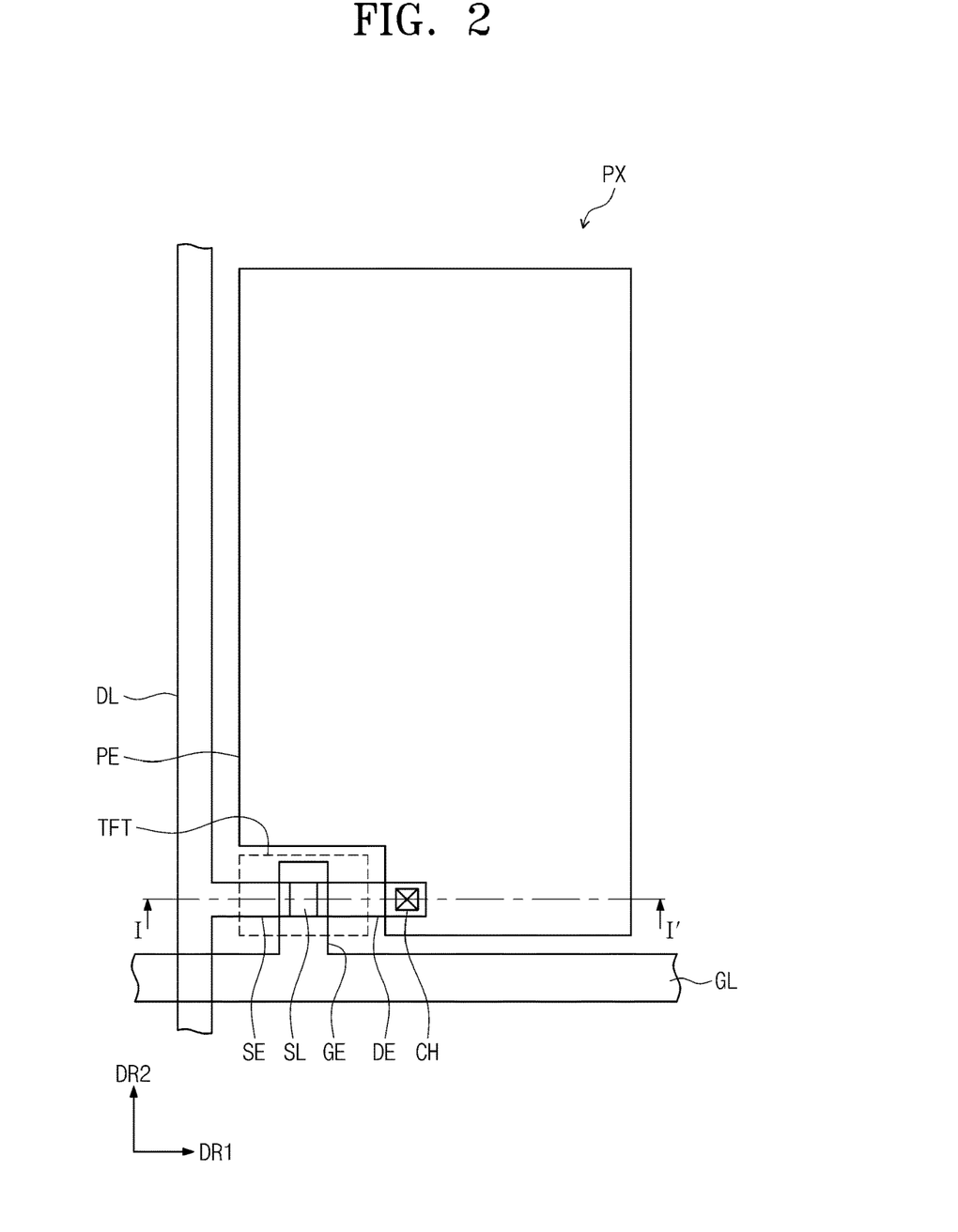
FIG. 2 is a plan view showing an exemplary embodiment of a pixel according to the invention.
Figure 3:
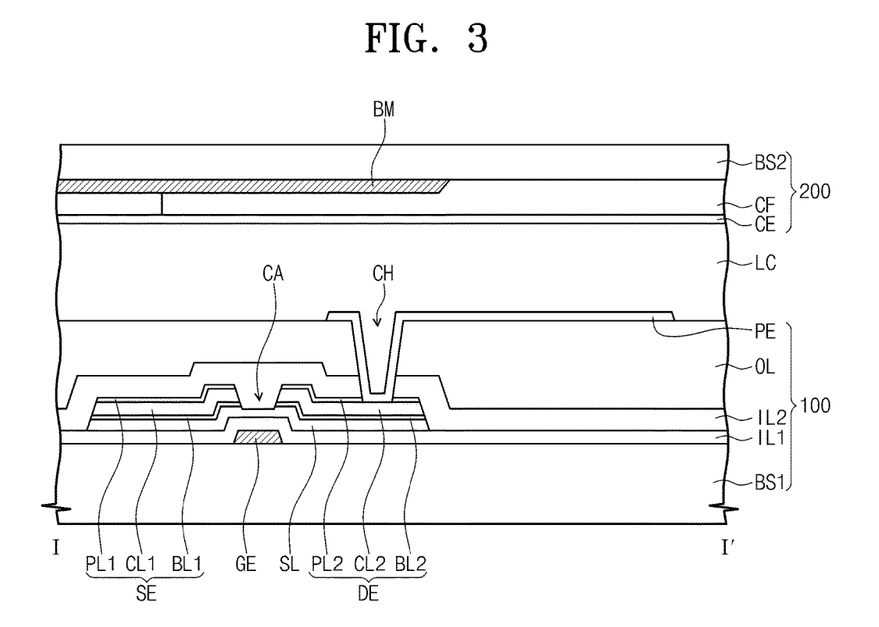
FIG. 3 is a cross-sectional view taken along line I-I' shown in FIG. 2.

FIG. 2 is a plan view showing an exemplary embodiment of a pixel according to the invention and FIG. 3 is a cross-sectional view taken along line shown in FIG. 2.

Referring to FIGS. 1 to 3, the thin film transistor substrate 100 includes a first base substrate BS1, a data line DL, a gate line GL and the pixel PX.

The first base substrate BS1 includes a transparent material such as glass or plastic. The gate line GL is elongated to extend in a first direction DR1, on the first base substrate BS1. The data line DL is elongated to extend in a second direction DR2 crossing the first direction DR1, on the first base substrate BS1. The gate line GL is insulated from the data line DL while crossing the data line DL.

FIG. 2 shows one data line DL and one gate line GL, but each of the data line DL and the gate line GL may be provided in a plural number within the display apparatus DP.

The pixel PX is connected to the gate line GL and the data line DL. The pixel PX includes a thin film transistor TFT, and a pixel electrode PE connected to the thin film transistor TFT.

The thin film transistor TFT includes a gate electrode GE, a source electrode SE, a drain electrode DE and a semiconductor layer SL.

The gate electrode GE is protruded from a main portion of the gate line GL to be elongated in the second direction DR2. The gate electrode GE and the gate line GL have a single-layer structure or a multi-layer structure in a cross-sectional view. The gate electrode GE and the gate line GL are formed of the same material to include the same material and to be disposed in a same layer of the thin film transistor substrate 100 among layers thereof on the first base substrate BS1.

The gate electrode GE includes at least one layer including a material selected from an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), titanium (Ti), tantalum (Ta) and manganese (Mn).

The thin film transistor substrate 100 further includes a first insulating layer IL1 disposed on the first base substrate BS1 to cover the gate electrode GE. The first insulating layer IL1 includes an insulating material, e.g., silicon oxide (SiOx) or silicon nitride (SiNx).

The first insulating layer IL1 respectively insulates each of the source electrode SE and the drain electrode DE from the gate electrode GE. Although not shown in figures, the gate line GL is insulated from the data line DL by the first insulating layer IL1 disposed between the gate line GL and the data line DL.

The semiconductor layer SL is disposed on the first insulating layer IL1 to partially overlap the gate electrode GE.

The semiconductor layer SL includes an oxide semiconductor material. The oxide semiconductor material includes at least one oxide material from among zinc (Zn), indium (In), tin (Sn) and gallium (Ga). In an exemplary embodiment, for instance, the semiconductor layer SL may include an indium-gallium-zinc oxide ("IGZO"), but should not be limited thereto or thereby.

The source electrode SE is protruded from a main portion of the data line DL to be elongated in the first direction DR1.

The drain electrode DE is disposed to be spaced apart from the source electrode SE. In the plan view, the source electrode SE and the drain electrode DE are each overlapped with a portion of the semiconductor layer SL.

The source electrode SE receives the data voltage through the data line DL and the drain electrode DE receives the data voltage from the source electrode SE via the semiconductor layer SL. The source electrode SE and the drain electrode DE each include the same material as that of the data line DL and have the same cross-sectional layer structure as that of the data line DL. The source electrode SE, the drain electrode DE and the data line DL are disposed in a same layer of the thin film transistor substrate 100 among layers thereof on the first base substrate BS1.

The source electrode SE and the drain electrode DE are disposed on the semiconductor layer SL and expose a portion of the semiconductor layer SL. A channel area CA of the thin film transistor TFT is formed in the exposed portion of the semiconductor layer SL. The channel area CA serves as a path through which electric charges move. The data voltage applied to the source electrode SE is applied to the drain electrode DE via the channel area CA defined in the semiconductor layer SL.

The source electrode SE collectively includes a first barrier layer BL1, a first wire layer CL1 and a first protective layer PL1, which are sequentially stacked one on another. The drain electrode DE collectively includes a second barrier layer BL2, a second wire layer CL2 and a second protective layer PL2, which are sequentially stacked one on another. That is, each of the source electrode SE and the drain electrode DE has a triple-layer structure in the cross-sectional view.

The first and second wire layers CL1 and CL2 include the same material and have the same layer structure. The first and second wire layers CL1 and CL2 are disposed in a same layer of the thin film transistor substrate 100 among layers thereof on the first base substrate BS1. In detail, each of the first and second wire layers CL1 and CL2 includes at least one metal. In an exemplary embodiment, for instance, the first and second wire layers CL1 and CL2 include copper (Cu) or a copper alloy.

The first barrier layer BL1 is disposed between the first wire layer CL1 and the semiconductor layer SL. The second barrier layer BL2 is disposed between the second wire layer CL2 and the semiconductor layer SL. The first and second barrier layers BL1 and BL2 are disposed in a same layer of the thin film transistor substrate 100 among layers thereof on the first base substrate BS1.

The first and second barrier layers BL1 and BL2 reduce or effectively prevent the metal material included in the first and second wire layers CL1 and CL2 from being diffused to the semiconductor layer SL.

Each of the first and second barrier layers BL1 and BL2 includes at least one material among vanadium (V), zirconium (Zr), tantalum (Ta), manganese (Mn), magnesium (Mg), chromium (Cr), molybdenum (Mo), cobalt (Co), niobium (Nb) and nickel (Ni). In addition, each of the first and second barrier layers BL1 and BL2 includes at least one metal oxide from among indium-zinc oxide ("IZO"), gallium-zinc oxide ("GZO") and aluminum-zinc oxide ("AZO").

The first protective layer PL1 is disposed on the first wire layer CL1 to cover an upper surface of the first wire layer CL1. The second protective layer PL2 is disposed on the second wire layer CL2 to cover an upper surface of the second wire layer CL2. The first and second protective layers PL1 and PL2 are disposed in a same layer of the thin film transistor substrate 100 among layers thereof on the first base substrate BS1.

The first and second protective layers PL1 and PL2 reduce or effectively prevent the first and second wire layers CL1 and CL2 from making contact with air, such that oxidation of the first and second wire layers CL1 and CL2 is reduced or effectively prevented. Accordingly, deterioration of electrical characteristics of the thin film transistor TFT due to denaturalization of the first and second wire layers CL1 and CL2 is reduced or effectively prevented.

Each of the first and second protective layers PL1 and PL2 includes the metal oxide. In the exemplary embodiment, each of the first and second protective layers PL1 and PL2 includes an indium oxide ("InO") in an amount greater than about 15 percent (%) by weight and less than about 30% by weight and includes a zinc oxide ("ZnO") in an amount greater than about 70% by weight and less than about 85% by weight.

The thin film transistor substrate 100 according to the illustrated exemplary embodiment may further include a second insulating layer IL2 disposed on the first insulating layer IL1 and on the source and drain electrodes SE and DE. The second insulating layer IL2 includes an insulating material, such as silicon oxide (SiOx) or silicon nitride (SiNx). The second insulating layer IL2 insulates the source electrode SE and the drain electrode DE from other elements among those of the thin film transistor substrate 100 disposed on the first base substrate BS1.

The thin film transistor substrate 100 may further include an organic material layer OL disposed on the second insulating layer IL2. The organic material layer OL planarizes an upper surface of the second insulating layer IL2 to provide a flat surface thereon.

The pixel electrode PE is disposed on the organic material layer OL. A contact hole CH is defined in the organic material layer OL and the second insulating layer IL2 such as by etching, and a portion of an upper surface of the drain electrode DE is exposed via the contact hole CH. The pixel electrode PE is electrically connected to the thin film transistor TFT via the contact hole CH. The pixel electrode PE receives the data voltage through the second wire layer CL2 that serves as a part of the drain electrode DE.

The pixel electrode PE may be a transparent electrode. In an exemplary embodiment, for instance, the pixel electrode PE includes a transparent conductive oxide, e.g., an indium-tin oxide ("ITO"), indium-zinc oxide ("IZO"), etc. Although not shown in figures, a plurality of slits may be defined in the pixel PE.

Although not shown in figures, the thin film transistor substrate 100 may further include a third insulating layer (not shown) disposed on (e.g., above) the organic material layer OL. The third insulating layer covers the pixel electrode PE.

In addition, the thin film transistor substrate 100 may further include an alignment layer (not shown) disposed on (e.g., above) the pixel electrode PE. The alignment layer controls an alignment direction of the liquid crystal molecules of the liquid crystal layer LC.

The opposite substrate 200 includes a second base substrate BS2, a color filter CF disposed on the second base substrate BS2 to represent colors, a black matrix BM disposed around the color filter CF to block the light, and a common electrode CE to form the electric field in cooperation with the pixel electrode PE. The liquid crystal molecules of the liquid crystal layer LC are controlled by the electric field.

As described above, the common electrode CE, the color filter CF and the black matrix BM are disposed in the opposite substrate 200, but should not be limited thereto or thereby. That is, the common electrode CE may be disposed in the thin film transistor substrate 100. Where the common electrode CE is disposed in the thin film transistor substrate 100, the common electrode CE is disposed on (e.g., above) or under the pixel electrode PE in the cross-sectional view.

FIGS. 4A to 4H are cross-sectional views showing an exemplary embodiment of a manufacturing method of a thin film transistor substrate according to the invention. In FIGS. 4A to 4H, the same reference numerals denote the same elements in FIGS. 1 to 3, and thus detailed descriptions of the same elements will be omitted in order to avoid redundancy.

Figure 4A:
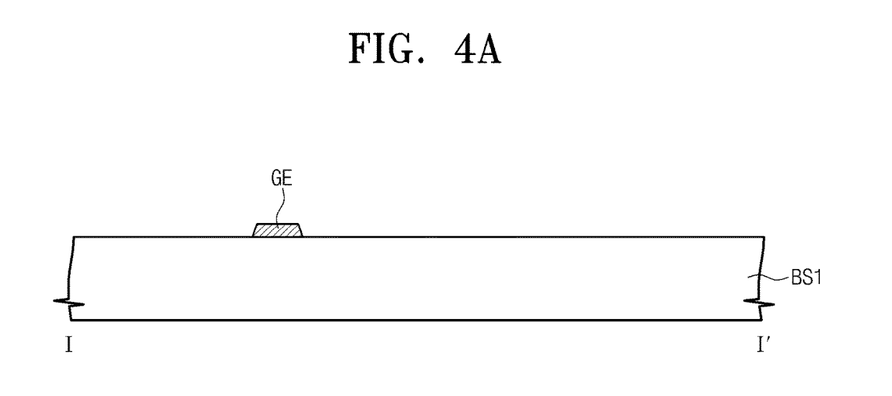
FIGS. 4A to 4H are cross-sectional views showing an exemplary embodiment of a manufacturing method of a thin film transistor substrate according to the invention.

Referring to FIG. 4A, the gate electrode GE is formed on the first base substrate BS1. In forming the gate electrode GE on the first base substrate BS1, gate lines GL (refer to FIGS. 1 and 2) are substantially simultaneously formed with the gate electrode GE. The gate electrode GE and the gate lines GL are formed by forming a conductive material layer through a depositing or sputtering process and patterning the formed conductive material layer such as through a photo-lithography process, but should not be limited thereto or thereby.

Figure 4B:
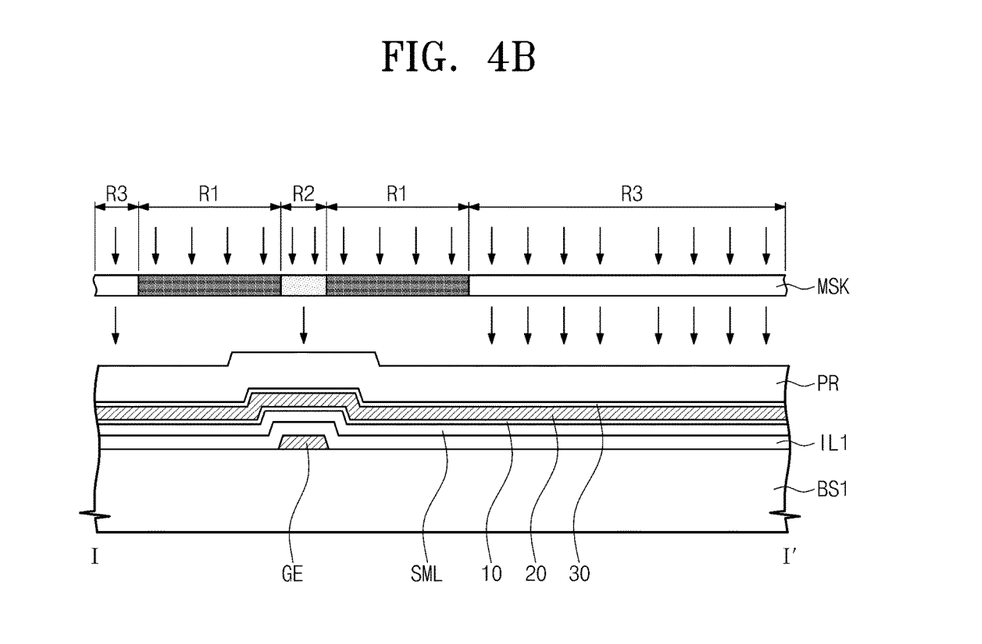
Figure 4C:
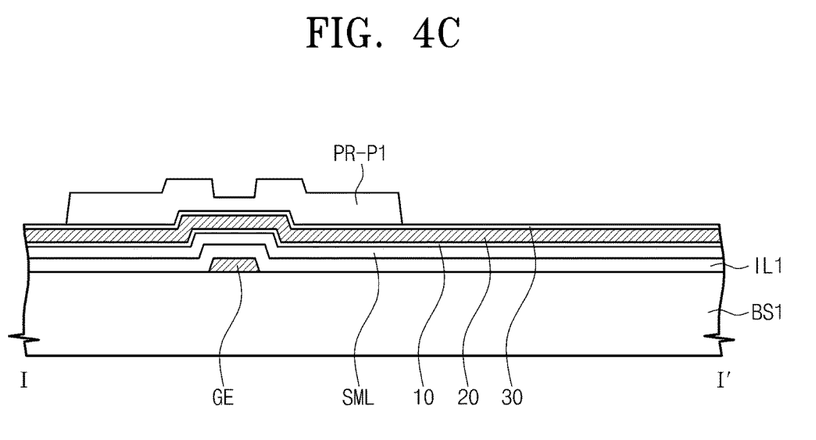

Referring to FIGS. 4B and 4C, the first insulating layer IL1 a semiconductor material layer SML, a barrier material layer 10, a metal material layer 20, a protective material layer 30 and a photoresist layer PR are sequentially formed on the gate electrode GE and on the first base substrate BS1.

The first insulating layer ILL the semiconductor material layer SML, the barrier material layer 10, the metal material layer 20 and the protective material layer 30 are formed by a deposition or sputtering process. A photoresist layer PR is formed on the above-described layers such as by coating a liquid-form photoresist material on the protective material layer 30. In the exemplary embodiment, the photoresist layer PR is formed of a positive-type photoresist material.

Then, a light is irradiated onto the photoresist layer PR on the above-described layers such as through a mask MSK disposed above the photoresist layer PR. The mask MSK may be a halftone mask or a diffraction mask and may include a first region R1 that blocks the light traveling thereto, a second region R2 that transmits a portion of the light and blocks the other portion of the light traveling thereto, and a third region R3 that transmits the light traveling thereto. Only the light that transmits through the mask MSK is irradiated onto the photoresist layer PR. In irradiating the light onto the photoresist layer PR, a portion thereof is removed such as at the second and third regions R2 and R3 to form a remaining portion thereof at the first and second regions R1 and R2.

The remaining portion of the photoresist layer PR from exposing the initially formed photoresist layer PR to the light using the mask MSK is developed to form a first photoresist layer pattern PR-P1. The first photoresist layer pattern PR-P1 is formed by completely removing the photoresist layer PR in the third region R3. The exposure amount of the light in the second region R2 is smaller than that in the third region R3, and thus the remaining photoresist layer PR in the second region R2 has a thickness smaller than a thickness of the remaining photoresist layer PR in the first region R1.

Here, the photoresist layer PR is formed of the positive-type photoresist, but should not be limited to the positive-type photoresist. That is, the photoresist layer PR may be formed of a negative-type photoresist. When the photoresist layer PR is formed of the negative-type photoresist, the photoresist layer pattern is formed only in the region through which the light transmits.

Figure 4D:
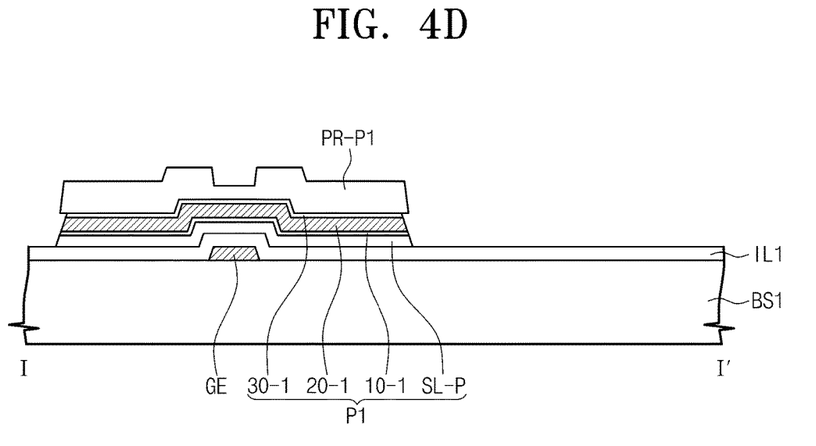

Referring to FIG. 4D, a portion of the layers underlying the first photoresist layer pattern PR-P1, which is not covered by the first photoresist layer pattern PR-P1, is etched using a first etchant until the first insulating layer IL1 is exposed at areas excluding the first photoresist layer pattern PR-P1. During the etching process, the first photoresist layer pattern PR-P1 is used as a mask. When the portion of the layers underlying the first photoresist layer pattern PR-P1, which is not covered by the first photoresist layer pattern PR-P1, is etched, a first structure P1 is formed of remaining portions of the underlying layers.

Due to the first etchant, the portion of the protective material layer 30, the metal material layer 20, the barrier material layer 10 and the semiconductor material layer SML are sequentially etched.

In the exemplary embodiment, the first etchant may include at least one from among a persulfate compound, an azole compound, a water-soluble amine compound, a phosphate compound, a chloride compound, an organic acid, a fluorine compound, a sulfonic acid compound and an inorganic acid.

Each of the semiconductor material layer SML, the barrier material layer 10, the metal material layer 20 and the protective material layer 30 is etched by the first etchant to remove portions thereof. Accordingly, a semiconductor pattern SL-P, a barrier pattern 10-1, a wire pattern 20-1 and a protective pattern 30-1 are formed.

The semiconductor pattern SL-P, the barrier pattern 10-1, the wire pattern 20-1 and the protective pattern 30-1 collectively form the first structure P1.

Figure 4E:
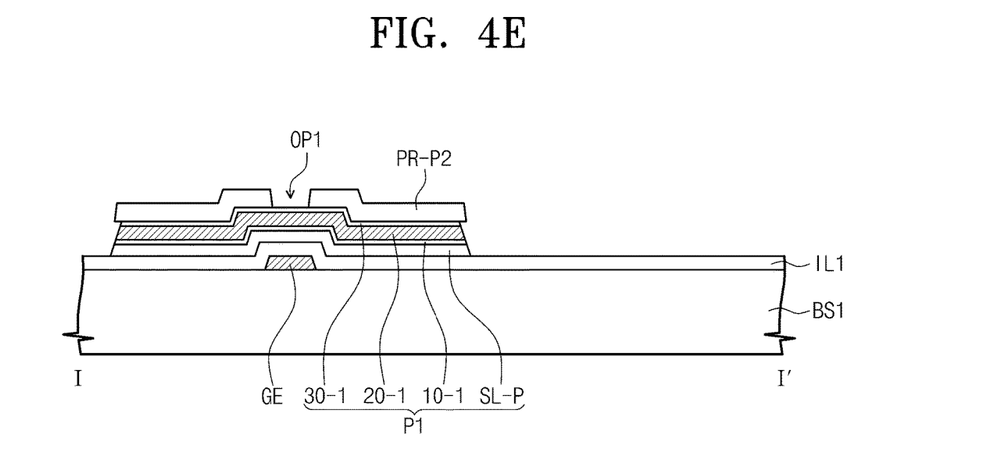

Referring to FIG. 4E, the first photoresist layer pattern PR-P1 is ashed to form a second photoresist layer pattern PR-P2 as a remaining portion of the first photoresist layer pattern PR-P1. The first photoresist layer pattern PR-P1 is etched from an upper surface thereof at a uniform etch rate.

Referring to the different thickness portions of the first photoresist layer pattern PR-P1 in FIGS. 4C and 4D, a portion of the first photoresist layer pattern PR-P1, which has a thickness smaller than that of a remaining portion of the first photoresist layer pattern PR-P1, is completely removed by the ashing the first photoresist layer pattern PR-P1 to form the second photoresist layer pattern PR-P2. As a result, a first opening OP1 is defined by portions of the second photoresist layer pattern PR-P2, and a portion of the first structure P1, which is overlapped with the gate electrode GE, is exposed via the first opening OP1.

Figure 4F:
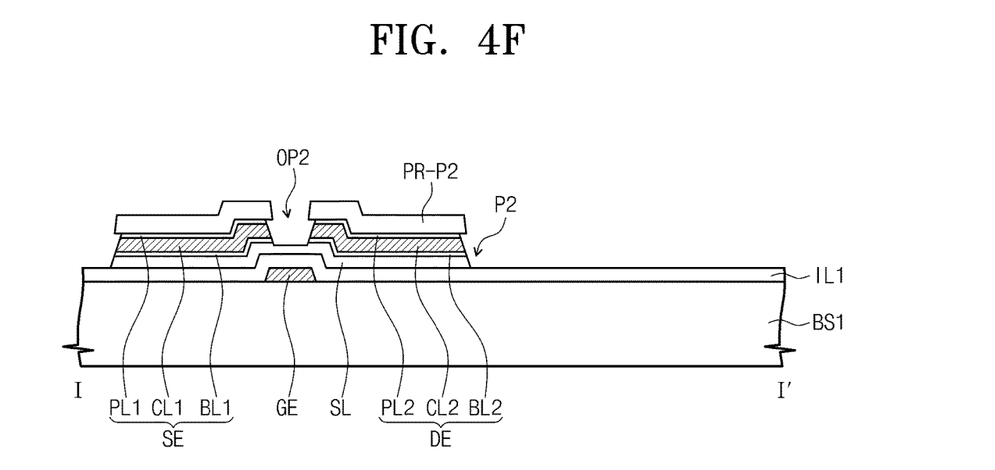

Referring to FIG. 4F, the first structure P1 is etched using the second photoresist layer pattern PR-P2 as a mask to form a second structure P2.

The second structure P2 is formed by etching the portion of the first structure P1, which is exposed through the second photoresist layer pattern PR-P2, using a second etchant. In etching the portion of the first structure P1, which is exposed through the second photoresist layer pattern PR-P2, a second opening OP2 is formed via the second structure P2 in the area corresponding to the first opening OP1.

In the exemplary embodiment, the second etchant may include at least one from among the persulfate compound, the azole compound, the water-soluble amine compound, the phosphate compound, the chloride compound, and the organic acid. In particular, the second etchant includes about 0.1% to about 20% by weight of the persulfate compound, about 0.01% to about 2% by weight of azole compound, about 0.1% to about 10% by weight of water-soluble amine compound, about 0.1% to about 5% by weight of phosphate compound, about 0.001% to about 1% by weight of chloride compound, about 0.1% to about 20% by weight of organic acid, and an amount of water that allows a total content of the second etchant to become 100% by weight.

The persulfate compound may include potassium persulfate ($K_2S_2O_8$), sodium persulfate ($Na_2S_2O_8$) or ammonium persulfate ($(NH_4)_2S_2O_8$). These are individually or jointly used.

The azole compound includes benzotriazole, aminotetrazole, aminotetrazole potassium salt, imidazole or pyrazole. These are individually or jointly used.

The water-soluble amine compound includes glycine, iminodiacetic acid, lysine, threonine, serine, asparaginic acid, parahydroxyphenyl glycine, dihydroxyethyl glycine, alanine, anthranilic acid, tryptophan, sulfamic acid, cyclohexylsulfamic acid, aliphatic amine sulfonic acid, taurine, aliphatic amine sulfinic acid or aminoethanesulfinic acid. These are individually or jointly used.

The phosphate compound includes $NaH_2PO_4$, $Na_2HPO_4$, $Na_3PO_4$, $(NH_4)H_2PO_4$, $(NH_4)_2HPO_4$, $(NH_4)_3PO_4$, $KH_2PO_4$, $K_2HPO_4$, $K_3PO_4$, $Ca(H_2PO_4)_2$, $Ca_2HPO_4$ or $Ca_3PO_4$. These are individually or jointly used.

The chloride compound includes hydrochloric acid (HCl), ammonium chloride ($NH_4Cl$), potassium chloride (KCl), iron chloride ($FeCl_3$), sodium chloride (NaCl), ammonium perchlorate ($NH_4ClO_4$), potassium perchlorate ($KClO_4$), sodium perchlorate ($Na_4ClO_4$) or zinc chloride ($ZnCl_2$). These are individually or jointly used.

The organic acid includes oxalic acid, oxalacetic acid, fumaric acid, malic acid, succinic acid, acetic acid, butyric acid, palmitic acid, tartaric acid, ascorbic acid, uric acid, sulfinic acid, tartaric acid, formic acid, citric acid, isocitric acid, α-ketoglutaric acid or glycolic acid. These are individually or jointly used.

The protective pattern 30-1, the wire pattern 20-1 and the barrier pattern 10-1 are etched by the second etchant.

The first and second protective layers PL1 and PL2 are formed by etching the protective pattern 30-1 using the second etchant. The first and second wire layers CL1 and CL2 are formed by etching the wire pattern 20-1 using the second etchant. The first and second barrier layers BL1 and BL2 are formed by etching the barrier pattern 10-1 using the second etchant.

Accordingly, the source electrode SE includes the first protective layer PL1, the first wire layer CL1 and the first barrier layer BL1 is formed. In addition, the drain electrode DE includes the second protective layer PL2, the second wire layer CL2 and the second barrier layer BL2 is formed.

The semiconductor pattern SL-P is partially etched by the second etchant, and thus the semiconductor layer SL is formed, in which the channel area is defined.

The semiconductor layer SL, the source electrode SE and the drain electrode DE collectively form the second structure P2.

Figure 4G:
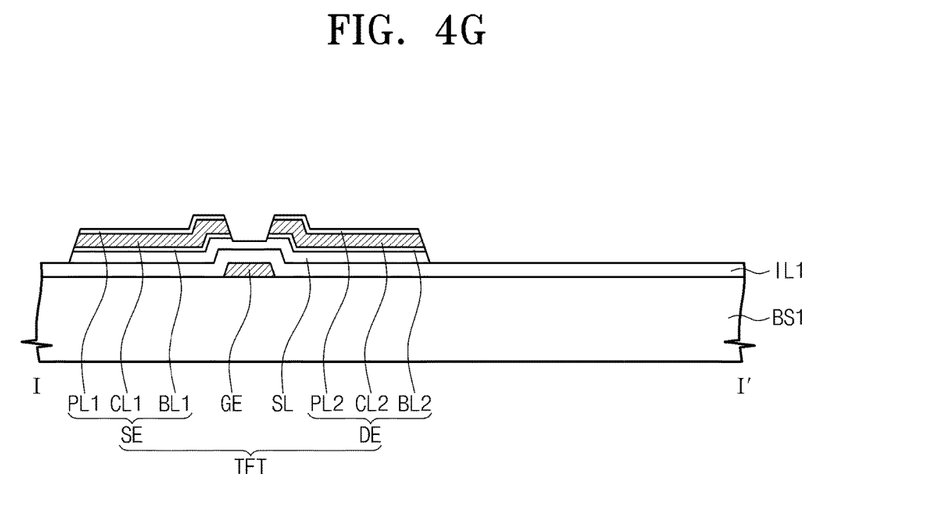

Referring to FIG. 4G, the second photoresist layer pattern PR-P2 is removed such as through an ashing process and/or a strip process.

After the second photoresist layer pattern PR-P2 is removed, a predetermined plasma gas (not shown) is supplied to an upper portion of the second structure. The plasma gas includes nitrogen oxide (NxO) or oxygen ($O_2$).

Figure 4H:
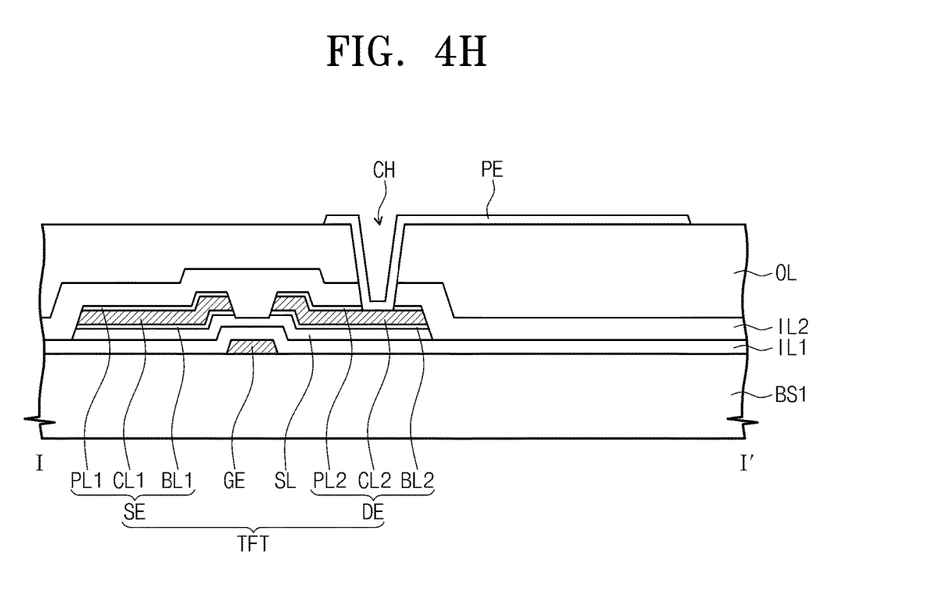

Referring to FIG. 4H, the second insulating layer IL2 and the organic material layer OL are sequentially formed on the first insulating layer IL1 and the thin film transistor TFT.

The second insulating layer IL2 insulates the thin film transistor TFT from other elements among those of the thin film transistor substrate 100 disposed on the first base substrate BS1 and reduces or effectively prevents infiltration of moisture of the organic material layer OL into the thin film transistor TFT.

The organic material layer OL is formed such as by coating an organic material on the first insulating layer IL1 and on the thin film transistor TFT, and drying the organic material. A flat surface of the organic material layer OL provides a flat surface of the thin film transistor substrate 100.

A contact hole CH is formed extending through thicknesses of the organic material layer OL and the second insulating layer IL2. The contact hole CH is formed in an area overlapped with the drain electrode DE.

The pixel electrode PE is formed on the organic material layer OL. The pixel electrode PE is connected to the drain electrode DE via the contact hole CH. The pixel electrode PE is formed such as by depositing a transparent conductive material on the organic material layer OL and patterning the transparent conductive material.

In a method of manufacturing a display apparatus, the thin film transistor substrate 100 manufactured by the above-mentioned method is coupled to an opposite substrate on which are defined elements such as a common electrode, a color filter and a black matrix. The liquid crystal layer is interposed between the thin film transistor substrate and the opposite substrate.

As described above, the thin film transistor substrate is manufactured by performing the photolithography process four times. Referring to FIG. 4F, when the second structure P2 is formed using the second photoresist layer pattern PR-P2 as the mask, sides of the first protective layer PL1 are formed to have a taper angle that is the same as or similar to that of the first wire layer CL1 and the first barrier layer BL1 with respect to the first base substrate BS1. In addition, sides of the second protective layer PL2 is formed to have a taper angle that is same as or similar to that of the second wire layer CL2 and the second barrier layer BL2 with respect to the first base substrate BS1. The sides of the layers within the source and drain electrodes SE and DE may coincide with each other so as to be aligned with each other.

Hereinafter, an etch degree of the first and second protective layers PL1 and PL2 (hereinafter, collectively referred to as "protective layer") according to a content of oxide materials included in the protective layer will be described in detail with reference to the following Table 1.

Table 1 shows the etch degree of the protective layer in which the content of the zinc oxide (ZnO) is different from the content of indium oxide (InO).

In Table 1, the protective layer of each of an exemplary embodiment according to the invention, a first comparative example and a second comparative example is formed on a barrier layer and a wire layer, which are sequentially stacked on the base substrate. The barrier layer and the wire layer of each of the first and second comparative examples are formed under the same conditions as those of the barrier layer and the wire layer of the exemplary embodiment.

However, the content of the oxide materials included in the protective layer of each of the first and second comparative examples is different from the content of the oxide materials included in the protective layer of the exemplary embodiment.

The protective layer according to the exemplary embodiment includes about 80% by weight of zinc oxide and about 20% by weight of indium oxide. The protective layer according to the first comparative example includes about 70% by weight of zinc oxide and about 30% by weight of indium oxide, and the protective layer according to the second comparative example includes about 85% by weight of zinc oxide and about 15% by weight of indium oxide.

The etch degree of the barrier layer and the wire layer of each of the exemplary embodiment example, the first comparative example and the second comparative example is uniform with respect to the second etchant, but the etch degree of the protective layer of each of the exemplary embodiment, the first comparative example, and the second comparative example is non-uniform with respect to the second etchant.

TABLE 1

|  | Exemplary embodiment | First comparative example | Second comparative example |
| --- | --- | --- | --- |
| Zinc oxide(ZnO)content | 80% by weight | 70% by weight | 85% by weight |
| Indium oxide(InO)content | 20% by weight | 30% by weight | 15% by weight |
| Degree of etch of protective layer | No variation | Protrusion (0.07 ± 0.0 μm) | Recess (0.05 ± 0.03 μm) |

In Table 1, the etch degree is determined by checking whether the protective layer formed by etching the protective pattern (refer to 30-1 in FIG. 4D) is protruded or recessed from the tapered side of the wire layer and the barrier layer.

As shown in Table 1, the etch degree of the protective layer becomes different depending on the content of the zinc oxide (ZnO) and the indium oxide (InO) therein.

Figure 5:
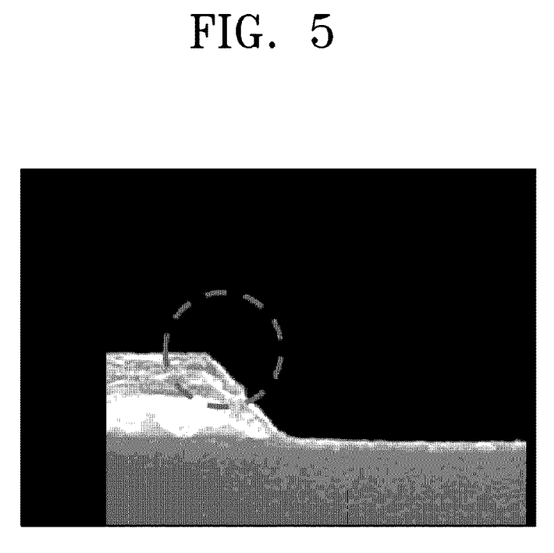
FIG. 5 is a scanning electron microscope ("SEM") image showing an exemplary embodiment of a protective layer according to the invention.
Figure 6:
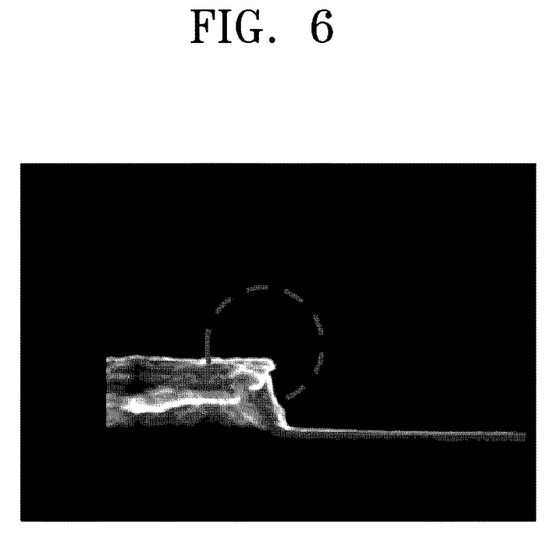
FIG. 6 is an SEM image showing a first comparative example of a protective layer.
Figure 7:
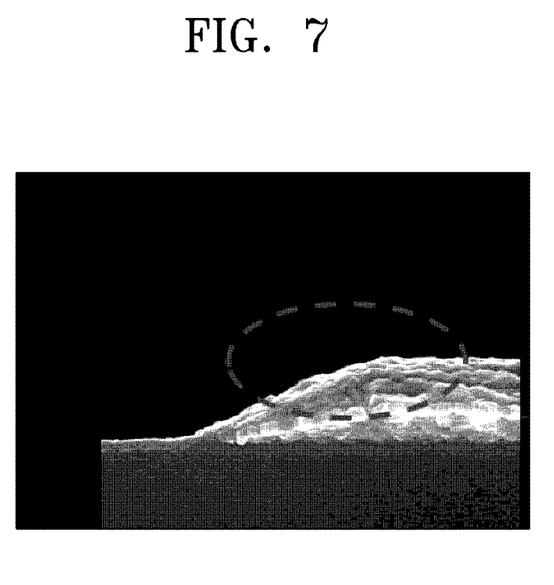
FIG. 7 is an SEM image showing a second comparative example of a protective layer.

FIG. 5 is an SEM image showing the protective layer according to the exemplary embodiment of the invention, FIG. 6 is an SEM image showing the protective layer according to the first comparative example, and FIG. 7 is an SEM image showing the protective layer according to the second comparative example.

Referring to FIG. 5, the protective layer according to the exemplary embodiment is etched to have sides at the same angle as those of the wire layer and the barrier layer, which are disposed under the protective layer. As indicated by a dotted-line circle in FIG. 5, the side surface of the protective layer is inclined at the same angle as that of the side surface of the wire layer and the barrier layer, and the inclined surface of the protective layer is located at the same surface as (e.g., coincides or aligns with) the inclined surfaces of the wire layer and the barrier layer, which are formed under the protective layer.

Referring to FIG. 6, the protective layer according to the first comparative example is less etched than the wire layer and the barrier layer, which are disposed under the protective layer of the first comparative example. As indicated by a dotted-line circle in FIG. 6, the side surface, i.e., the inclined surface, of the protective layer according to the first comparative example is protruded in a lateral direction with respect to the side surface, i.e., the inclined surface, of the wire layer and the barrier layer of the first comparative example.

Referring to FIG. 7, the protective layer according to the second comparative example is more etched than the wire layer and the barrier layer, which are disposed under the protective layer of the second comparative example. As indicated by a dotted-line circle in FIG. 7, the side surface, i.e., the inclined surface, of the protective layer according to the second comparative example is recessed in a lateral direction with respect to the side surface, i.e., the inclined surface, of the wire layer and the barrier layer of the second comparative example.

Where an insulating layer above the protective layer or the protective layer deposited on the metal material layer and protruded or recessed similar to the structures in the first and second comparative examples, a crack occurs in the insulating layer or the protective layer.

However, when the protective layer, which includes zinc oxide in an amount greater than about 70% by weight and less than about 85% by weight and indium oxide in an amount greater than about 15% by weight and less than about 30% by weight, is etched using the second etchant disclosed herein, the protective layer may be formed without the protrusion or the recess described above. As a result, the crack in the insulating layer may be reduced or effectively prevented even though the insulating layer is formed on (e.g., above or after) the protective layer. That is, deposition characteristics of the insulating layer disposed above the protective layer and covering the thin film transistor are improved and defects in the insulating layer are reduced. Thus, the electrical characteristics of the thin film transistor substrate may be improved.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A thin film transistor substrate comprising:
    a base substrate; and
    a thin film transistor on the base substrate, the thin film transistor comprising:
        a gate electrode on the base substrate;
        a semiconductor layer on the gate electrode;
        a source electrode overlapping the semiconductor layer; and
        a drain electrode overlapping the semiconductor layer and spaced apart from the source electrode,
        each of the source electrode and the drain electrode comprising:
            a wire layer comprising a metal; and
            a protective layer on the wire layer,
            wherein the protective layer comprises zinc oxide in an amount greater than about 70% by weight and less than about 85% by weight and indium oxide in an amount greater than about 15% by weight and less than about 30% by weight.

2. The thin film transistor substrate of claim 1, wherein the semiconductor layer comprises an oxide semiconductor.

3. The thin film transistor substrate of claim 2, wherein the metal comprises copper or a copper alloy.

4. The thin film transistor substrate of claim 1, wherein each of the source electrode and the drain electrode further comprises a barrier layer between the semiconductor layer and the wire layer, the barrier layer blocking diffusion of a material included in the wire layer to the semiconductor layer.

5. The thin film transistor substrate of claim 4, wherein the barrier layer comprises at least one of indium-zinc-oxide, gallium-zinc oxide and aluminum-zinc oxide.

6. A display apparatus comprising:
    a thin film transistor substrate;
    an opposite substrate facing the thin film transistor substrate; and
    a liquid crystal layer between the thin film transistor substrate and the opposite substrate,
    the thin film transistor substrate comprising:
        a base substrate; and
        a thin film transistor on the base substrate, the thin film transistor comprising:
            a gate electrode on the base substrate,
            a semiconductor layer on the gate electrode and comprising an oxide semiconductor, and
            an electrode layer partially overlapping the semiconductor layer, the electrode layer comprising:
                a wire layer comprising a metal; and
                a protective layer on the wire layer,
                wherein the protective layer comprises zinc oxide in an amount greater than about 70% by weight and less than about 85% by weight and indium oxide in an amount greater than about 15% by weight and less than about 30% by weight.

7. The display apparatus of claim 6, wherein the electrode layer comprises a source electrode and a drain electrode spaced apart from each other.

8. The display apparatus of claim 7, wherein the electrode layer further comprises a barrier layer between the wire layer and the semiconductor layer, the barrier layer comprising at least one of indium-zinc oxide, gallium-zinc oxide and aluminum-zinc oxide.

9. The display apparatus of claim 6, further comprising:
    a gate line on the base substrate, elongated in a first direction and connected to the gate electrode; and
    a data line on the base substrate, elongated in a second direction crossing the first direction and connected to the electrode layer.

* * * * *